United States Patent [19]
Ooka

[11] Patent Number: 4,740,480
[45] Date of Patent: Apr. 26, 1988

[54] METHOD FOR FORMING A SEMICONDUCTOR DEVICE WITH TRENCH ISOLATION STRUCTURE

[75] Inventor: Hideyuki Ooka, Tokyo, Japan

[73] Assignee: NEC Corporation, Tokyo, Japan

[21] Appl. No.: 95,406

[22] Filed: Sep. 11, 1987

Related U.S. Application Data

[62] Division of Ser. No. 748,453, Jun. 25, 1985, abandoned.

[30] Foreign Application Priority Data

Jun. 25, 1984 [JP] Japan ................................ 59-130458

[51] Int. Cl.$^4$ .......................................... H01L 21/473
[52] U.S. Cl. .......................................... 437/61; 437/41; 437/67; 357/49
[58] Field of Search ....................... 437/61, 67; 357/49

[56] References Cited

U.S. PATENT DOCUMENTS

| | | | |
|---|---|---|---|
| 4,307,180 | 12/1981 | Pogge | 437/67 |
| 4,404,735 | 9/1983 | Sakurai | 437/67 |
| 4,419,813 | 12/1983 | Iwai | 437/67 X |
| 4,449,287 | 5/1984 | Maas et al. | 437/67 |
| 4,463,493 | 8/1984 | Momose | 437/67 X |
| 4,506,435 | 3/1985 | Plisken | 357/49 |
| 4,611,386 | 9/1986 | Goto | 437/67 |

OTHER PUBLICATIONS

Kern et al., *RCA Review*, vol. 43, No. 3, Sep. 1982, pp. 423-457.

*Primary Examiner*—George T. Ozaki
*Attorney, Agent, or Firm*—Burns, Doane, Swecker & Mathis

[57] ABSTRACT

Formation of an integrated circuit device with the trench isolation process is disclosed. A plurality of circuit elements such as transistors are isolated from one another by trenches formed in field isolation regions of a semiconductor substrate. Each trench should be filled with appropriate materials to maintain the flatness of the surface of the substrate. Borophosphosilicate glass (BPSG) is employed as the material filled into each trench.

4 Claims, 7 Drawing Sheets

METHOD FOR FORMING A SEMICONDUCTOR DEVICE WITH TRENCH ISOLATION STRUCTURE

This application is a divisional, of application Ser. No. 748,453, filed June 25, 1985 and now abandoned.

BACKGROUND OF THE INVENTION

The present invention relates to a semiconductor integrated circuit device, and more particularly to an isolation structure among circuit elements in an integrated circuit device.

As integrated circuit devices are pushed toward very large scale integration, it is required that not only each circuit element but also field isolation regions are formed to be miniaturized. For this purpose, a so-called "trench isolation structure" has been proposed in place of LOCOS (Local Oxidation of Silicon) isolation structure which is commonly used in MOS (Metal-Oxide-Semiconductor) integrated circuit devices. In the trench isolation structure, each circuit element is isolated by trenches which are formed at field isolation portions of a semiconductor substrate. Since the trenches can be formed in a fine pattern by utilizing a dry etching method such as the well-known reactive ion etching technique, the field isolation regions become miniaturized to reduce their occupying areas on the semiconductor substrate.

Each trench should be filled with appropriate materials in order to maintain the flatness of the surface of the substrate. According to the prior art devices, silicon or a silicon dioxide is employed as the material to fill the trenches. However, these materials bring unsatisfactory results.

More specifically, in the case of employing silicon, the surface portion of a silicon layer filling the trenches is converted into an oxide film for insulation by thermal oxidation. At this time, the thermally grown oxide film applies stresses to the substrate portion around each trench to cause crystallographic damage. Moreover, the silicon layer filling the trench is frequently charged electrically. As a result, the electrical characteristics of each circuit element are changed, and leak current flowing paths are formed among the circuit elements.

In the case of employing a silicon dioxide, it is very difficult to fill each trench with a silicon dioxide film to the height just equal to the surface of the substrate. Rather, the silicon oxide film is formed to project or cave in with respect to the surface of the substrate, and in that case a very sharp step is formed along each trench. If patterning of wiring conductive layers, such as gate wirings, is performed thereon, two or more wiring conductors may be short-circuited by wiring material disposed along the very sharp step.

In addition, the respective trenches are formed with various widths, and therefore both silicon and a silicon oxide cannot often fill a trench having a relatively large width.

OBJECTS AND SUMMARY OF THE INVENTION

It is, therefore, an object of the present invention to provide a semiconductor integrated circuit device having an improved trench isolation structure.

It is another object of the present invention to provide an integrated circuit device with a trench isolation structure in which each trench is filled with a novel material to achieve the desired isolation.

It is still another object of the present invention to provide a method of producing a semiconductor device with an improved trench isolation structure.

A semiconductor integrated circuit device according to one aspect of the present invention comprises a semiconductor substrate, a plurality of circuit elements each formed in the semiconductor substrate, a plurality of trenches formed in the semiconductor substrate to isolate the circuit elements from one another, and a silicate glass containing both boron and phosphorus and filling each trench.

According to another aspect of the present invention, there is provided a method of producing a semiconductor device, which comprises the steps of forming a protecting layer on a semiconductor substrate, selectively removing the protecting layer and the semiconductor substrate to form a plurality of trenches, forming a glass layer containing both boron silicate and phosphorus silicate to cover the protecting layer and to fill each trench, fusing the glass layer containing both boron silicate and phosphorus silicate to provide a smoothly contoured surface thereof, selectively etching the glass layer having the smoothly contoured surface to leave a portion of the glass layer which fills each trench, removing the protecting layer, fusing the remaining glass layer filling each trench to make the surface thereof round, and forming a plurality of circuit elements in portions of the semiconductor substrate isolated by the trenches.

Thus, the glass layer containing both boron silicate and phosphorus silicate, i.e., borophosphosilicate glass (called hereinafter "BPSG"), is employed as a material to fill each trench in the present invention. Since the BPSG is an insulating material, the oxidation of the surface of the BPSG film is not necessary and the BPSG film is not undesirably charged electrically, as is the case with silicon trench isolation. The BPSG film is fused to flow and reflow at a relatively low temperature, making a smoothly contoured or rounded surface. Accordingly, the surface of the semiconductor substrate is delineated smoothly, and very sharp steps are not formed, which occur in the silicon dioxide trench isolation method. Since the BPSG film has a fusable characteristic, it can fill the trench completely, even if its width is relatively large, while maintaining flatness of the surface of the substrate.

Moreover, the BPSG film has relatively low intrinsic stress. This means that a trench having a considerably large depth is filled with a thicker crack-free layer.

Silicate glass containing phosphorus alone (i.e., phosphosilicate glass called as "PSG") and that containing boron alone (i.e., borosilicate glass called as "BSG") have been known previously as a fusable material. However, the inventor has discovered through experiments that neither PSG film nor BSG film is successfully employed as the material to fill the trench.

More specifically, the flow temperature of the PSG film is higher than that of the BPSG film by a few hundred degrees celsius. Fusing the silicate glass at a high temperature applies a thermal distortion and a change in impurity concentration profile of the substrate. Further, the contoured surface of the PSG film by its fusion is not made so smooth, which fills up the trench having a relatively large width. If the phosphorus concentration of the PSG fill is made high, the flow temperature is lowered. However, such a high phosphorus-containing PSG film is more hygroscopic and thus results in increased susceptibility to corrosion for aluminum wiring conductors in plastics-molded integrated circuit devices. Moreover, the etching rate of the PSG film in a buffered hydrofluoric acid solution (called "BHF solution") which is widely used as a chemical etching solution for semiconductor devices, is higher than that of the thermally grown silicon dioxide. The PSG film filling up the trench is therefore etched too much, when it is subjected to the BHF solution in order to etch the silicon dioxide formed on the semiconductor substrate, resulting in the formation of a very sharp step along each trench. In the BPSG film, the etching rate in the BHF solution can be selected to be equal to or smaller than that of the etching rate for the silicon dioxide by adjusting the boron concentration in the BPSG film, and therefore the formation of sharp steps along each trench is prevented.

The flow temperature of the BSG film having the same boron concentration as the BPSG film is also higher than that of the BPSG film. In particular, the evenness of the contoured surface by the fusion of the BSG film is inferior to the PSG film. According to the inventor's experiments, the smoothly contoured surface of the BSG film filling up the trench having a relatively large width was not obtained by heat treatment at about 950° C. for 0.5 to 1 hour. Moreover, the BSG film does not provide an alkali ion gettering capability, and therefore a change in threshold voltage of a field effect transistor may occur. Another disadvantage of the BSG film is that its chemical stabilization in the glass structure is inferior to the BPSG film.

In both PSG and BSG films, the intrinsic stress is larger than the BPSG film, and hence cracks are more easily generated when thicker PSG and BSG films are used to fill deeper trenches.

As described above, both PSG film and BSG film are inferior to the BPSG film as the insulating layer to fill the trench.

From the inventor's investigation of the BPSG film, it has been also found that the boron concentration is favorably within a range of 8 mol % to 12 mol % and the favorable phosphorus concentration is 3 mol % to 6 mol %. The BPSG film having such boron and phosphorus concentrations has an etching rate in the BHF solution smaller than that of thermally grown silicon dioxide, less hygroscopicity, and an excellent flow or reflow characteristic.

BRIEF DESCRIPTION OF THE DRAWINGS

The above and other objects, advantages and features of the present invention are more apparent from the following description taken in conjunction with the accompanying drawings, in which

FIG. 5 is a graph showing etch-rates of BPSG and PSG films in a BHF solution with respect to boron and phosphorus concentrations, respectively.

DESCRIPTION OF THE PRIOR ART

Figure 1A:
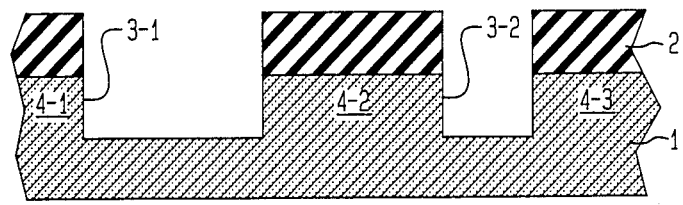
FIGS. 1A to 1E are cross-sectional views showing the manufacturing steps of a semiconductor device according to prior art.

Referring to FIGS. 1A to 1E, the manufacturing steps according to prior art are shown in order to facilitate the understanding of the present invention. In the illustration of the prior art, a semiconductor substrate 1 is covered with a photoresist layer 2 which is relatively removed to expose field isolation regions of the substrate 1 other than circuit element forming regions (i.e., active regions) 4-1 to 4-3, and the substrate 1 is thereafter selectively etched by reactive ion etching method under the usage of the layer 2 as a mask to form a plurality of trenches 3-1 and 3-2 as shown in FIG. 1A. The trench 3-1 has a width larger than the trench 3-2, since the active region 4-1 is located a greater distance from the region 4-2 than the region 4-3.

Figure 1B:
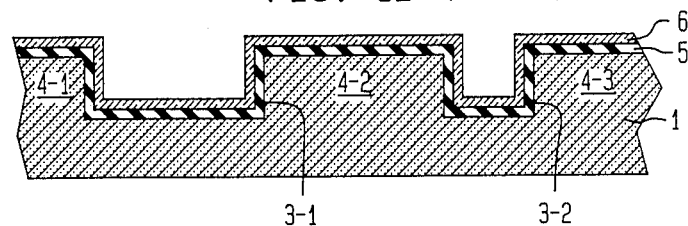

The photoresist layer 2 is then removed, and a silicon dioxide film 5 is formed on the surfaces of the active regions 4-1 to 4-3 and on bottom and side surfaces of the trenches 3-1 and 3-2. A silicon nitride film 6 is then formed on the silicon oxide film 5 by a chemical vapor deposit (CVD) method. The result is shown in FIG. 1B.

Figure 1C:
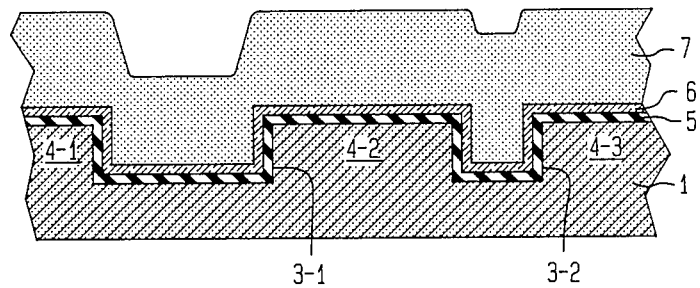

Subsequently, a polycrystalline silicon layer 7 is formed by the CVD method to fill the trenches 3-1 and 3-2 with silicon (see FIG. 1C). At this time, since the trench 3-1 has a larger width, the polycrystalline silicon portion filling the trench 3-1 is smaller in thickness than that filling the trench 3-2.

Figure 1D:
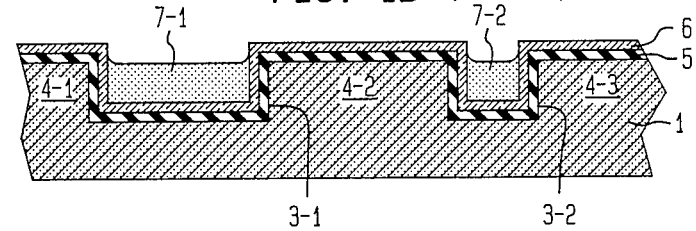

The polycrystalline silicon layer 7 is subjected to etching so as to leave portions 7-1 and 7-2 in the trenches 3-1 and 3-2, respectively, as shown in FIG. 1D. At this time, the portion 7-2 is left to substantially fill the trench 7-2, but the portion 7-1 fills only one part of the trench 7-1. This is because the silicon layer 7 cannot be formed with a sufficient thickness above the trench 7 due to the larger width of the trench 7 (see FIG. 1C).

Figure 1E:
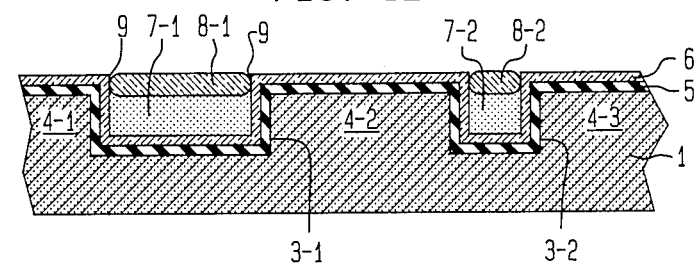

The polycrystalline silicon layers 7-1 and 7-2 are thermally oxidized at their surface portions to produce thermally grown silicon dioxide films 8-1 and 8-2, as shown in FIG. 1E. Silicon nitride film 6 provides an oxidation-resist characteristic, and therefore the surface portions of the active regions 4-1 to 4-3 are not oxidized.

It is well known that the surface of the silicon layers 7-1 and 7-2 expand in volume when they ar converted into oxides by the thermal oxidation. As a result, the active regions 4-1 to 4-3 are subjected to crystallographic damages. Circuit elements such as transistors which are thereafter formed in the active regions 4-1 to 4-3, are thereby deteriorated in electrical characteristics.

Moreover, since the silicon layer 7-1 fills only a part of the trench 7-1 (see FIG. 1D), the edge portion of the silicon dioxide 8-1 may locate below the surface of the substrate 1, as shown in FIG. 1E. As a result, very sharp steps or gaps 9 are formed along the edge portion of the oxide film 8-1. If a conductive layer is formed and then selectively etched to pattern gate wiring conductors, the conductive materials within the gaps 8 are not substantially etched out, so that two or more wiring layers are short-circuited. This serious disadvantage may occur in the case of employing silicon dioxide as the layers 7-1 and 7-2.

In addition, the silicon layers 7-1 and 7-2 are often charged undersirably to form current leakage paths among the active regions 4-1 to 4-3.

DETAILED DECRIPTION OF THE PREFERRED EMBODIMENT

Figure 2A:
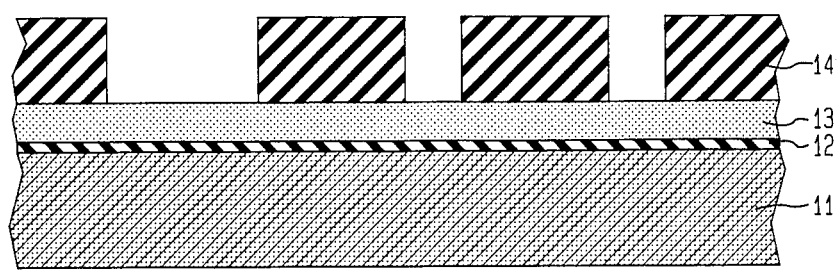
FIGS. 2A to 2L are cross-sectional views showing the manufacturing steps of a preferred embodiment according to the present invention.

Referring to FIGS. 2A to 2L, an integrated circuit device according to an embodiment of the present invention will be described hereinafter along with its manufacturing steps. A silicon substrate 11 of one conductivity type (a p-type in this embodiment) is provided, on which a thermally grown silicon dioxide film 12 having a thickness of about 500 and a polycrystalline silicon layer 13 of a thickness of 0.5 to 1.5 μm is formed in that order. The polycrystalline silicon layer 13 is then covered with a photoresist layer 14 which is selectively removed at portions corresponding to field isolation regions of the substrate 11. The layer 13 is formed to protect element forming regions (i.e. active regions) of the substrate 11 in a dry-etching step which will be mentioned hereinafter. The result is shown in FIG. 2A.

Figure 2B:
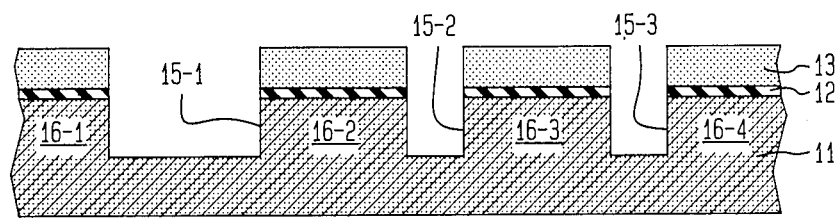

By use of the photoresist layer 14 as a mask, the polycrystalline silicon layer 13 and the silicon dioxide film 12 are selectively removed, and further the substrate 11 is selectively etched to form a plurality of trenches 15-1 to 15-2, as shown in FIG. 2B. Active regions 16-1 to 16-4 of the substrate 11 are thereby isolated from one another by the trenches 15-1 to 15-3. In this step, the reactive ion etching method is preferably employed to obtain a desired width of the respective trenches 15-1 to 15-3. As is apparent from FIG. 2B, the width of the trench 15-1 is considerably larger than the widths of other trenches 15-2 and 15-3.

Figure 2C:
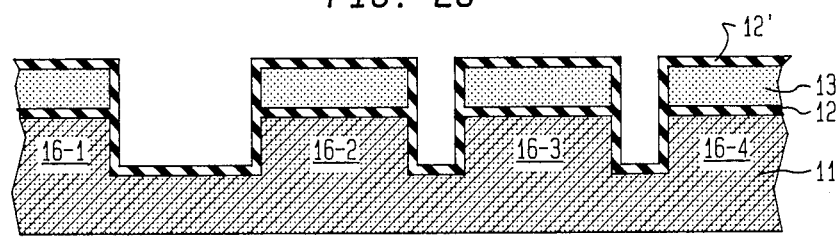

The photoresist layer 14 is then removed, and the surface of the polycrystalline layer 13 and the bottom and side surfaces of the trenches 15-1 to 15-3 are oxidized to form a silicon dioxide film 12 (see FIG. 2C).

Figure 2D:
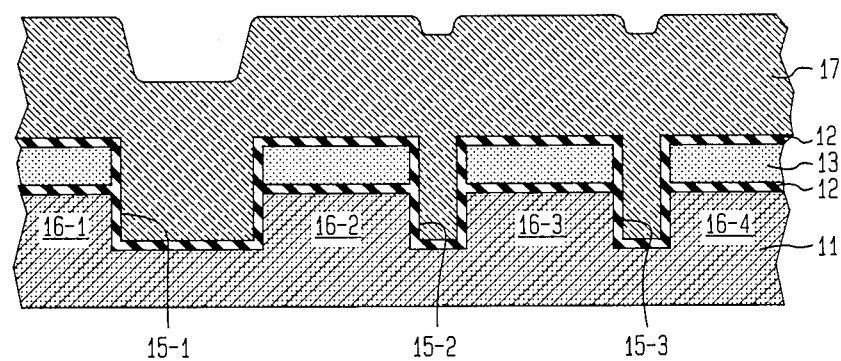

A borophosphosilicate glass layer, i.e., BPSG layer 17 is thereafter formed to fill up the trenches 15-1 to 15-3, as shown in FIG. 2D. At this time, since the width of the trench 15-1 is relatively large, BPSG fills in the trench 15-1 with less thickness than those filling the trenches 15-2 and 15-3. In this embodiment, the BPSG layer 17 is deposited by the chemical vapor deposition (CVD) method employing diborane ($B_2H_6$), monosilane ($SiH_4$) and phosphine ($PH_3$) to contain boron at a concentration of 10 mol % and phosphorus at a concentration of 5 mol %.

The device shown in FIG. 2D is subjected to a heat treatment at about 950° C. in $N_2$ or steam atmosphere for 30 minutes. The BPSG film 17 is thereby fused to flow, and then forms a very smoothly contoured surface as shown by reference numeral 17' in FIG. 2E.

Dry etching process is carried out to remove the BPSG film 17' with the very smoothly contoured surface by a predetermined thickness. As shown in FIG. 2F, the polycrystalline silicon layer 13 is thereby exposed. Thus, the layer 13 is used to protect the active regions 16-1 to 16-4 from damage brought about by this etching process. On the other hand, BPSG layers 18-1 to 18-3 are left in the trenches 15-1 to 15-2, respectively, and further, the very smoothly contoured surface of the BPSG layer 17' (see FIG. 2E) is reflected on the surface of the respective BPSG layers 18-1 to 18-3. Therefore, the concavity of the respective BPSG layers 18-1 to 18-3 from the surface of the layer 13 is suppressed sufficiently.

The polycrystalline silicon layer 13 is thereafter removed. The result is shown in FIG. 2G. The BPSG layers 18-1 to 18-3 and the silicon dioxide film 12 is not etched away.

The device showing in FIG. 2G is subjected to the etching in a buffered hydrofluoric acid solution, i.e., in BHF solution.

FIG. 5 shows a relationship between the etching rate of the BPSG layer in the BHF solution and that of the thermally grown silicon dioxide film in the BHF solution. As is understood from FIG. 5, the etching rate of the BPSG layer becomes smaller than that of the silicon dioxide film, when the BPSG layer contains boron at a concentration equal to or greater than 8 mol %. In addition, it can be seen that the etching rate of BPSG layer in the BHF solution is controlled substantially by the concentration of boron. In this embodiment, the concentration of boron in BPSG layer is chosen to be 10 mol %.

Figure 2E:
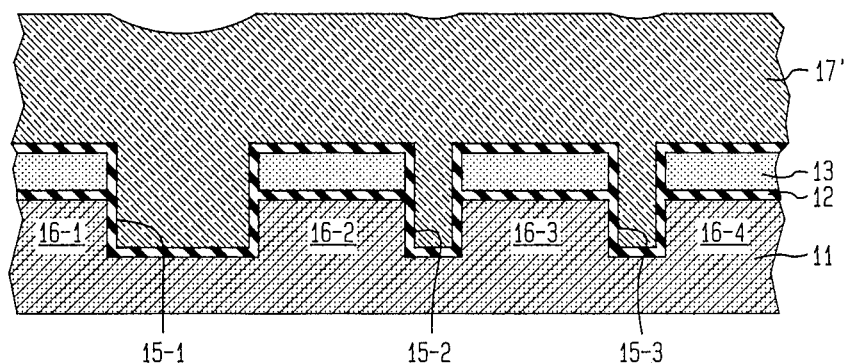
Figure 2F:
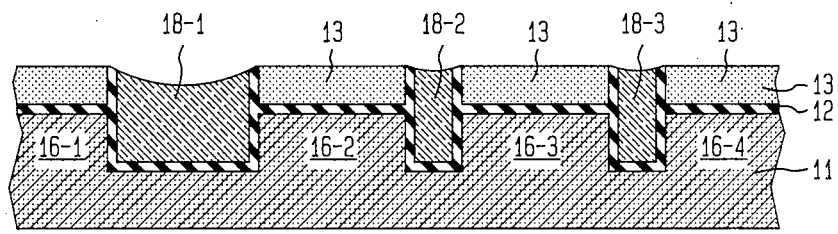
Figure 2G:
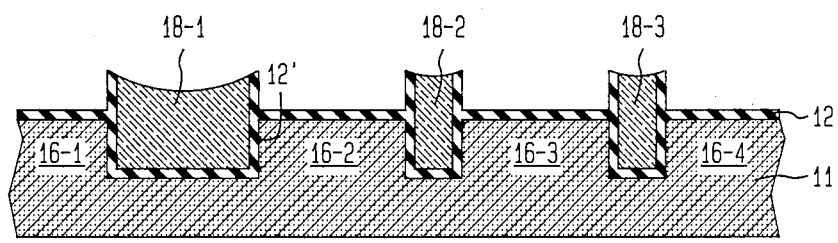
Figure 2H:
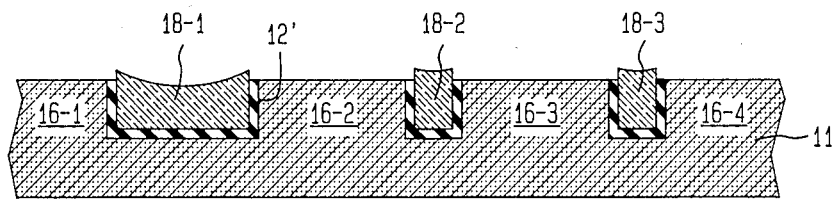

Accordingly, the silicon dioxide film 12 is removed from the surface of the active regions 16-1 to 16-4 when the BPSG layers 18-1 to 18-3 are etched slightly, whereby each of the BPSG layers projects from the substrate as shown in FIG. 2H.

Figure 2I:
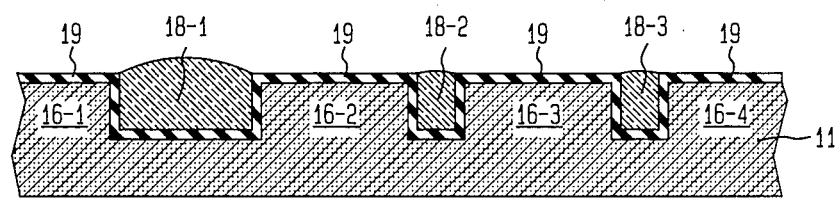

The surface portions of the active regions 16-1 to 16-4 are converted by thermal oxidation into silicon dioxide films 19 which are used as gate insulating films of MOS transistors. The heat treatment at this step fuses the BPSG layers 18-1 to 18-3 again. In other words, the BPSG layers 18-1 to 18-3 reflow. The surfaces of the BPSG layers 18-1 to 18-3 thus become round in a convex shape, because of the surface tension of the respective BPSG layers 18-1 to 18-3. The result is shown in FIG. 2I. Since the surfaces of the BPSG layers 18-1 to 18-3 become round in a convex shape, any sharp step or gap is not formed along a boundary between each BPSG layer and each active region.

Figure 2J:
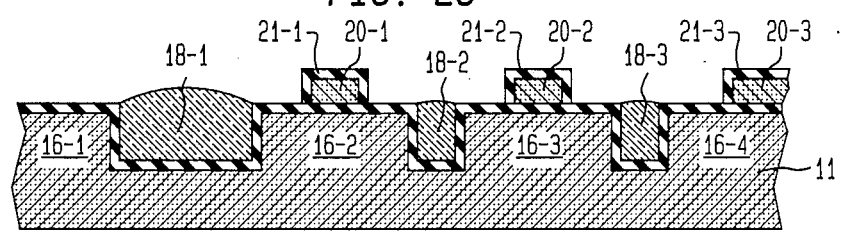
Figure 2K:
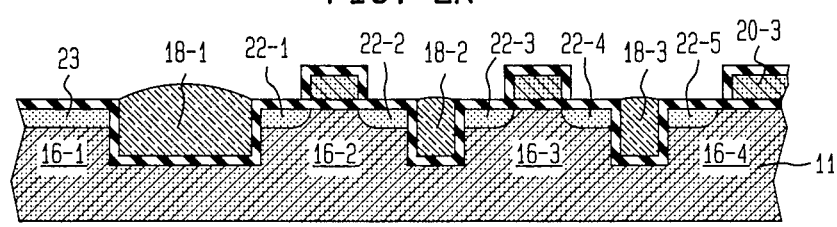

As shown in FIG. 2J, a polycrystalline silicon layer is deposited any then selectively removed to form gate electrodes and gate wiring conductor layers 20-1 to 20-3 for MOS transistors which are to be formed in the active regions 16-2 to 16-4, respectively. Any polycrystalline silicon layer is not left in undesired portions, particularly along the boundary between each BPSG layer and each active region. The gates 20-1 to 20-3 are covered with silicon dioxide films 21-1 to 21-3.

Impurity ions representing the opposite conductivity type (i.e., an N-type) such as phosphorus or arsenic are implanted into the respective active regions 16-1 to 16-4, followed by an annealing step for activating the implanted impurity ions. As a result, a resistor region 23 is formed in the active region 16-1, and source and drain regions 22-1 to 22-5 of the MOS transistors formed in the active regions 16-2 to 16-4. The gates 20-1 to 20-3 are also doped with impurities to enhance their conductivity.

Figure 2L:
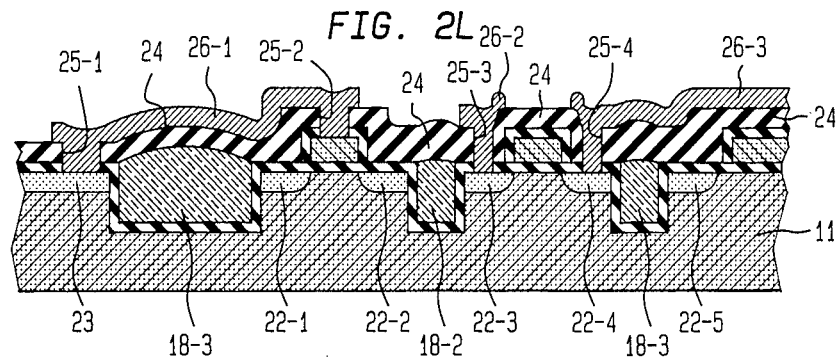

A silicon dioxide layer 24 is thereafter deposited by the CVD process, and selectively removed to form contact holes 25-1 to 25-4. An aluminum layer is deposited to fill the holes 25-1 to 25-4 and then selectively removed to form metal wiring conductors 26-1 to 26-3. The result is shown in FIG. 2L.

Since the BPSG layers 18-1 to 18-3 are insulating materials, they do not incur undesirable electric charges. Moreover, the BPSG layers 18-1 to 18-3 do not cause any damage to the respective active regions 16-1 to 16-4 and do not form any sharp step or gap 9 shown in FIG. 1E between each field isolation region and each active region. In addition, the BPSG layer is capable of gettering alkali ions and has less intrinsic stress. Thus, the change by alkali ions in threshold voltage of the MOS transistors formed in the active regions 16-2 to 16-4 is suppressed, and a trench having a larger width and/or depth such as the trench 15-1 is filled with a stress-free insulating layer.

As has been already mentioned, the other fusable silicate glasses such as phosphosilicate glass (PSG) and borosilicate glass (BSG) are unsuitable for being employed as the materials filling up each trench. The reasons therefor will be explained hereinafter in more detail.

The most important characteristic of a fusable silicate glass which is employed as the material filling each trench is that the fusable silicate glass be capable of flowing or reflowing to form the very smoothly contoured surface shown in FIG. 2E at a temperature of 800° C. to 1100° C. and within one hour even if the trench has a relatively large width.

Figure 4:
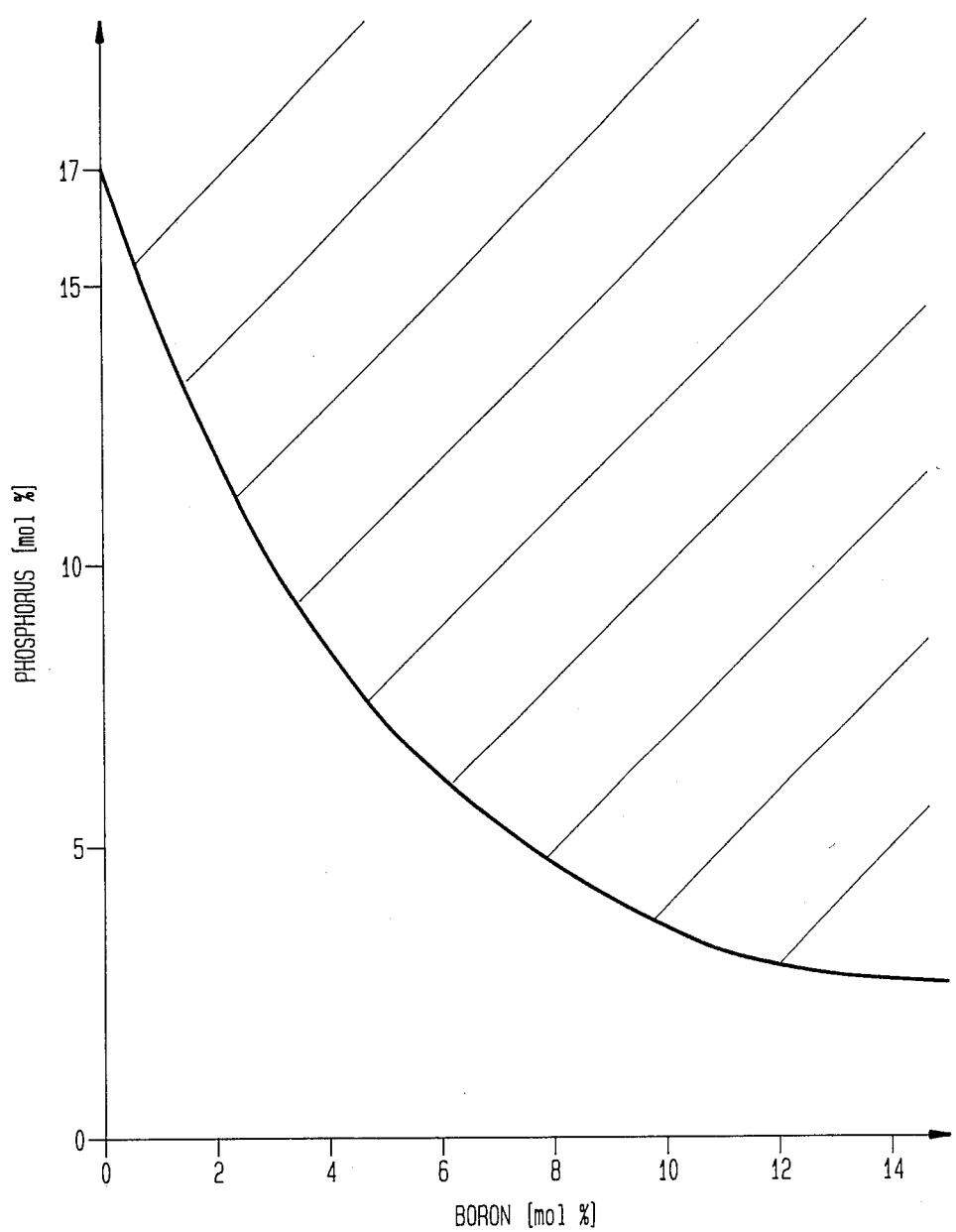
FIG. 4 is a graph showing a relationship between boron and phosphorus concentrations in a BPSG film for providing satisfactory flow or reflow characteristics.

FIG. 4 shows a relationship between boron and phosphorus concentrations for obtaining a fusable silicate glass having a roundish surface in a convex shape, which has been determined from the inventor's experiments. The ratio between the depth and width of the trench which has been used in the experiments is 1:5. The trench having such a ratio is frequently used as the worst case. The fusable silicate glass containing boron and/or phosphorus at various concentrations is deposited to fill up the trench with thickness twice as large as the depth of the trench, and the trench isolation structure is formed in accordance with FIGS. 2E to 2I. As a result, it has been found that the fusable silicate glass containing boron and/or phosphorus with concentrations falling within an area shown by oblique lines in FIG. 4 can form a roundish surface in a convex shape. As is apparent from FIG. 4, the fusable silicate glass containing boron alone, i.e., borosilicate glass (BSG) cannot form the roundish surface. Further, the PSG containing phosphorus at a concentration equal to or larger than 17 mol % makes the roundish surface. However, the PSG film containing phosphorus in such a high concentration is more hygroscopic which causes corrosion of aluminum wiring conductors. The concentration of phosphorus which is satisfactory in hygroscopic characteristics is lower than 15 mol %, but such a PSG film does not form the roundish surface in a convex shape.

Figure 3A:
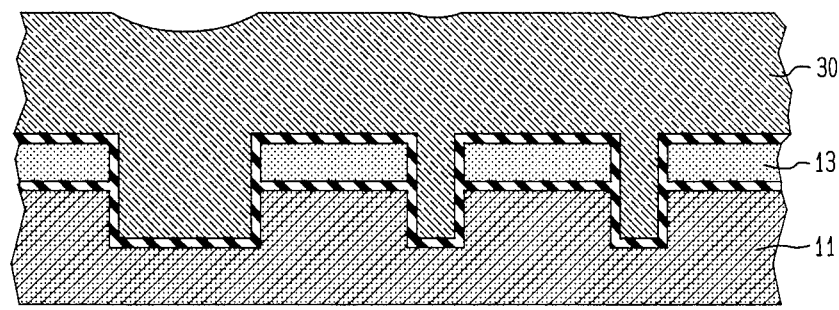
FIGS. 3A to 3G are cross-sectional views showing the manufacturing steps in the case of employing a PSG film as an insulating material filling up each trench, which correspond to FIGS. 2E to 2L.

More specifically, the flowing effect of the PSG film 30 is insufficient, and therefore the very smoothly contoured surface is not obtained as is apparent from the comparison between FIG. 2E and FIG. 3A.

Figure 3B:
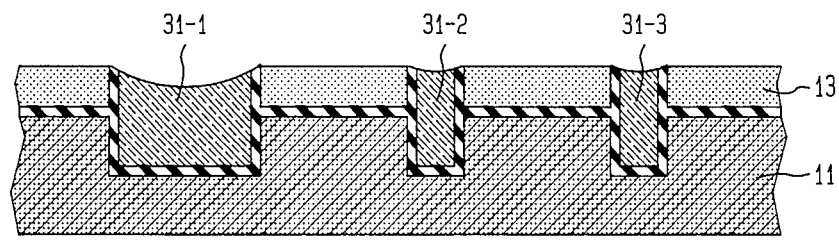
Figure 3C:
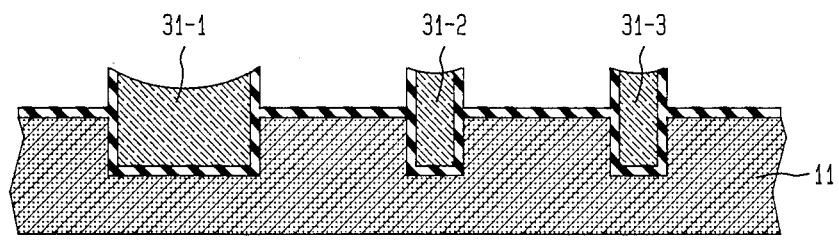

The PSG film 30 is subjected to etching to a predetermined thickness, so that the surface configuration of PSG layer 31-1 left into the trench 15-1 having a relatively large width is reflected by the surface shape of the PSG layer 30, as shown in FIG. 3B. The concavity of the surface of the PSG layer 31-1 is considerably large.

The PSG film as a material to fill the trench further has an undesirable characteristic that the etching rate of the PSG film in the BHF solution is considerably higher than that of the thermally grown silicon dioxide, as shown in FIG. 5.

Figure 3D:
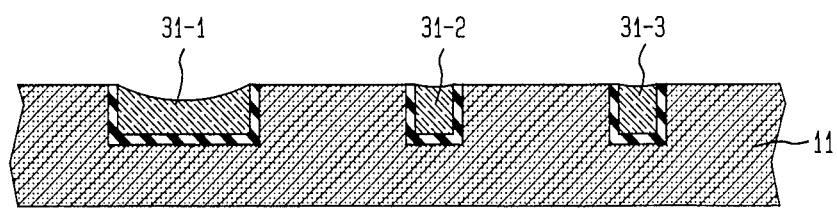
Figure 3E:
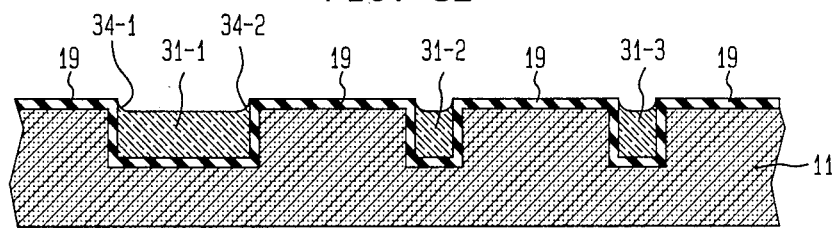

For this reason, when the silicon dioxide film is removed by the BHF solution, an excess of remaining PSG layers 31-1 to 31-3 is removed. As a result, the PSG layers 31-1 to 31-3 cave in with respect to the surface of each active region, as shown in FIG. 3D. This means that the surfaces of the PSG layers 31-1 to 31-3 do not become roundish in a convex shape even if the layers 31-1 to 31-3 reflow by the thermal oxidation for forming the silicon dioxide films 19. Rather, the reflowing PSG layers 31-1 to 31-3 creep up along the oxide film 16 on the side surfaces of the trenches 15-1 to 15-3, so that very sharp steps 34-1 and 34-2 are formed along the boundary between the field isolation region and the active region, as shown in FIG. 3E.

Figure 3F:
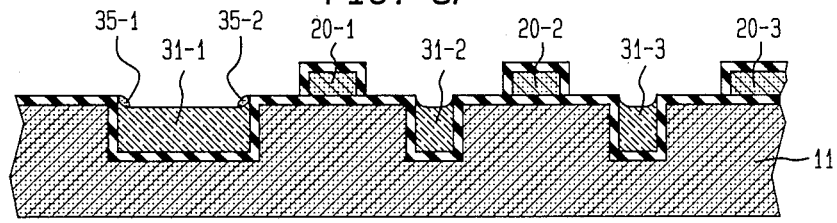
Figure 3G:
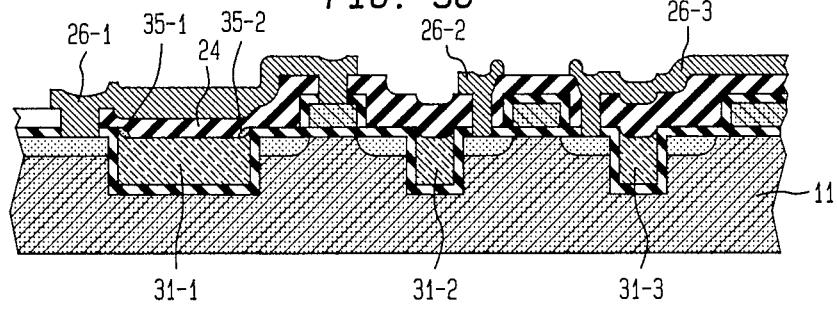

These steps 34-1 and 34-2 cause polycrystalline silicon paths 35-1 and 35-2 to be left therealong during the gate formation step as shown in FIG. 3F. These paths 35-1 and 35-2 remain unremoved thereafter as shown in FIG. 3G. Two or more conductive layers generally cross over the PSG layer 31-1, and in that case they are short-circuited by paths 35-1 and 35-2.

As described above, neither a PSG layer nor BSG layer can be acceptably employed as the insulating material to fill the trench.

It is desirable from FIG. 5 that the concentration of boron in the BPSG layer is equal to or larger than 8 mol % in order to obtain an etching rate of the BPSG in BHF solution equal to or smaller than that of the thermally grown silicon dioxide. Further, it has been found that the BPSG layer is also more hygroscopic and deteriorates the flowing and reflowing effects if the boron concentration in the BPSG layer becomes larger than 12 mol %. Accordingly, it is desirable that the concentration of boron in the BPSG layer is within a range of 8 mol % to 12 mol %. From the investigation of the BPSG layer containing boron in a concentration of 8 mol % to 12 mol %, it has been found that the favorable concentration of phosphorus is 3 mol % to 6 mol %.

The present invention can be applied to P-channel MOS integrated circuits, complementary MOS integrated circuits, metal gate MOS integrated circuits, and other integrated circuits of very large integration.

What is claimed is:

1. A method for forming trench isolation in a silicon substrate, comprising the steps of forming a first silicon oxide layer on said silicon substrate, depositing a polycrystalline silicon layer on said first silicon oxide layer, forming by reactive ion etching a pattern of trenches each penetrating said polycrystalline silicon layer and said first silicon oxide layer and into the interior of said silicon substrate, oxidizing the surfaces of said trenches and said polycrystalline silicon layer to form a second silicon oxide layer thereon, depositing a borophosphosilicate glass layer over said second silicon oxide layer to fill each of said trenches, fusing said borophosphosilicate glass layer by first heat treatment to form a smoothly contoured surface thereof, removing said borophosphosilicate glass layer by dry etching until the surface of said polycrystalline silicon layer is exposed to thereby separate said borophosphosilicate glass into a plurality of portions filling said trenches, removing said polycrystalline silicon layer, removing said first silicon oxide layer to expose the surfaces of portions of said silicon substrate each surrounded by said trenches, oxidizing the surfaces of said portions of said silicon substrate by second heat treatment to form a third silicon oxide layer thereon, and fusing said portions of said borophosphosilicate glass by said second heat treatment to make the surfaces thereof round in a convex shape.

2. The method as claimed in claim 1, wherein said first silicon oxide layer is removed by a buffered hydrofluoric acid solution.

3. The method as claimed in claim 2, wherein said borophosphosilicate glass contains boron in a concentration of 8 mol % to 12 mol % and phosphorus in a concentration of 3 mol % to 6 mol %.

4. A method of producing a semiconductor device, comprising the steps of preparing a trenched silicon substrate having a plurality of trenches formed therein to surround active regions thereof and thick polycrystalline silicon layers formed on said active regions thereof, depositing a borophosphosilicate glass layer filling said trenches and covering said polycrystalline silicon layers, fusing said borophosphosilicate glass layer to make a smoothly contoured surface thereof, removing said borophosphosilicate glass layer by dry etching until the upper surface of said polycrystalline silicon layers are exposed to thereby separate said borophosphosilicate glass layer into a plurality of portions which fill said trenches, respectively, removing said polycrystalline silicon layers, fusing said borophosphosilicate glass portions to make the surfaces thereof round, and forming in said active regions impurity regions having a conductivity type of opposite to that of said silicon substrate.

* * * * *